United States Patent
Seo et al.

(10) Patent No.: US 8,981,423 B2
(45) Date of Patent: Mar. 17, 2015

(54) POWER SEMICONDUCTOR DEVICE AND METHOD OF FABRICATING THE SAME

(71) Applicant: Samsung Electro-Mechanics Co., Ltd., Suwon (KR)

(72) Inventors: Dong Soo Seo, Suwon (KR); Jaehoon Park, Suwon (KR); Kee Ju Um, Suwon (KR); Chang Su Jang, Suwon (KR); In Hyuk Song, Suwon (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 66 days.

(21) Appl. No.: 13/937,589

(22) Filed: Jul. 9, 2013

(65) Prior Publication Data

US 2014/0291722 A1      Oct. 2, 2014

(30) Foreign Application Priority Data

Mar. 29, 2013   (KR) .................. 10-2013-0034668

(51) Int. Cl.
  *H01L 29/66*   (2006.01)
  *H01L 29/739*   (2006.01)
(52) U.S. Cl.
  CPC ...... *H01L 29/7395* (2013.01); *H01L 29/66348* (2013.01)

USPC ........................................... 257/139; 438/138
(58) Field of Classification Search
  CPC ................ H01L 29/66348; H01L 29/7395
  USPC ........................................... 257/139; 438/138
  See application file for complete search history.

(56) References Cited

U.S. PATENT DOCUMENTS

| 2007/0040213 | A1 | 2/2007 | Hotta et al. |
| 2008/0079066 | A1 | 4/2008 | Hamaguchi et al. |
| 2011/0101417 | A1* | 5/2011 | Ogura et al. ................... 257/139 |
| 2011/0272761 | A1* | 11/2011 | Haeberlen et al. ............ 257/334 |
| 2014/0217464 | A1* | 8/2014 | Higuchi et al. ................ 257/139 |

FOREIGN PATENT DOCUMENTS

| JP | 2005-150246 | 6/2005 |
| KR | 10-2008-0029746 | 4/2008 |

* cited by examiner

*Primary Examiner* — Trung Q Dang

(57) ABSTRACT

There is provided a power semiconductor device, including a plurality of trench gates formed to be spaced apart from each other by a predetermined distance, a current increasing part formed between the trench gates and including a first conductivity-type emitter layer and a gate oxide formed on a surface of the trench gate, and an immunity improving part formed between the trench gates and including a second conductivity-type body layer, a preventing film formed on the surface of the trench gate, and a gate oxide having a thickness less than that the gate oxide of the current increasing part.

17 Claims, 6 Drawing Sheets

A-A'

POWER SEMICONDUCTOR DEVICE AND METHOD OF FABRICATING THE SAME

CROSS-REFERENCE TO RELATED APPLICATIONS

This application claims the priority of Korean Patent Application No. 10-2013-0034668 filed on Mar. 29, 2013, in the Korean Intellectual Property Office, the disclosure of which is incorporated herein by reference.

BACKGROUND OF THE INVENTION

1. Field of the Invention

The present invention relates to a power semiconductor device and a method of fabricating the same.

2. Description of the Related Art

An insulated gate bipolar transistor (IGBT) refers to a transistor in which a gate is manufactured using a metal oxide semiconductor (MOS) and a p-type collector layer is formed on a rear surface to thereby have bipolarity.

Since a power metal oxide semiconductor field effect transistor (MOSFET) according to the related art has been developed, the MOSFET has been used in a field requiring fast switching characteristics.

However, due to structural limitations of the MOSFET, a bipolar transistor, a thyristor, gate turn-off thyristors (GTOs), and the like have been used in technical fields requiring high voltages.

The IGBT having low forward loss and fast switching speed characteristics has been widely applied to a field in which it is impossible to use an existing thyristor, a bipolar transistor, a metal oxide semiconductor field effect transistor (MOSFET), or the like.

Describing an operational principle of the IGBT, in the case in which the IGBT device is turned on, an anode thereof has a voltage higher than that of a cathode applied thereto, and in the case in which a gate electrode has a voltage higher than a threshold voltage of the device applied thereto, polarity of a surface of a p-type body region disposed at a lower end of the gate electrode is reversed, to thereby form an n-type channel.

An electron current injected into a drift region through a channel derives an injection of hole current from a high density p-type collector layer located below the IGBT device similar to a base current of the bipolar transistor.

Due to a high concentration injection of a few carriers as described above, a conductivity modulation, increasing conductivity in the drift region from tens to hundreds of times, may occur.

Unlike the MOSFET, since a resistive component in the drift region may be significantly reduced due to the conductivity modulation, an application of high voltage is possible.

Current flowing toward the cathode is divided into electron current flowing through the channel and hole current flowing through a junction between the p-type body and the n-type drift region.

The IGBT is a p-n-p structure between the anode and the cathode in the substrate structure. Therefore, since a diode is not embodied in the IGBT, unlike in the case of the MOSFET, separate diodes should be connected in an inverse-parallel manner.

The above-mentioned IGBT has largely major characteristics such as maintenance of blocking voltage, a decrease in conduction loss, and an increase in a switching speed.

According to the related art, a magnitude of the voltage required for the IGBT is increased and durability of the device is required to be increased.

However, in accordance with miniaturization of the device, in the case in which the magnitude of the voltage is increased, latch-up is generated due to a structure of the device, such that the device may easily break down.

The latch-up refers to that in the case in which a p-n-p-n parasitic thyristor, structurally present in the IGBT, is operated, the IGBT enters a state in which it is no longer adjusted by a gate, such that a significant current may flow in the IGBT and the device may overheat and break down.

In addition, in accordance with the miniaturization of the device, a short circuit may be generated in the IGBT.

Such a short circuit, largely generated in a case of a load connected to the device, for example, an inductive load such as a motor, refers to a case in which a current is applied to the gate in a state in which a high voltage is applied to the IGBT, such that a high voltage and a large current are simultaneously applied to the IGBT.

Short circuit immunity of the IGBT is evaluated as a time for which the device withstands such pressure without being broken down in the above-mentioned short circuit state.

Therefore, in order to secure the miniaturization and reliability of the IGBT, a scheme of securing robustness for the latch-up and increasing short circuit immunity is required.

However, current density and short circuit immunity of the IGBT have a trade-off relationship with each other.

Therefore, a scheme of simultaneously developing and improving current density and short circuit immunity is required.

The following related art document relates to an insulating gate type semiconductor apparatus.

The insulating gate type semiconductor apparatus described in the above-mentioned Related Art Document has a constant thickness of a gate insulating film formed on a surface of the gate, but only has a difference in terms of a size of a contact, unlike the present invention.

In addition, the Related Art Document does not disclose a configuration in which a preventing film is formed on an immunity improving unit, unlike the present invention.

RELATED ART DOCUMENT

Korean Patent Laid-open Publication No. 2008-0029746

SUMMARY OF THE INVENTION

An aspect of the present invention provides a power semiconductor device having a gate insulating film of an immunity improving part having a thickness less than that of a gate of a current increasing unit, in order to simultaneously develop and improve short circuit immunity and an increase in current density of the power semiconductor device having a trade-off relationship to each other.

In addition, another aspect of the present invention provides a power semiconductor device having a preventing film formed on a surface of the gate of the immunity improving unit.

According to an aspect of the present invention, there is provided a power semiconductor device, including: a plurality of trench gates formed to be spaced apart from each other by a predetermined distance; a current increasing part formed between the trench gates and including a first conductivity-type emitter layer and a gate oxide formed on a surface of the trench gate; and an immunity improving part formed between the trench gates and including a second conductivity-type body layer, a preventing film formed on the surface of the trench gate, and a gate oxide having a thickness less than that the gate oxide of the current increasing part.

The trench gates may be formed so that a distance from a center of one trench gate to a center of a trench gate adjacent thereto is 3 μm.

The preventing film may be formed of silicon nitride (SiN).

The preventing film may have a thickness of 100 Å to 1,000 Å.

The gate oxide of the current increasing part may have a thickness of 1,000 Å to 2,000 Å.

According to an aspect of the present invention, there is provided a power semiconductor device, including: a first conductivity-type drift layer; a second conductivity-type body layer formed on the drift layer; a plurality of trench gates formed to penetrate through the body layer and a portion of the drift layer; a current increasing part formed between the trench gates and including a first conductivity-type emitter layer formed on the body layer and a gate oxide formed on a surface of the trench gate; an immunity improving part including a preventing film formed on the surface of the trench gate and a gate oxide having a thickness less than that the gate oxide of the current increasing part; and a second conductivity-type collector layer formed blow the drift layer.

The trench gates may be formed so that a distance from a center of one trench gate to a center of a trench gate adjacent thereto is 3 μm.

The preventing film may be formed of silicon nitride (SiN).

The preventing film may have a thickness of 100 Å to 1,000 Å.

The gate oxide of the current increasing part may have a thickness of 1,000 Å to 2,000 Å.

The power semiconductor device may further include a first conductivity-type buffer layer between the drift layer and the collector layer.

The power semiconductor device may further include: an emitter metal layer formed on the emitter layer and electrically connected to the emitter layer; and a collector metal layer formed below the collector layer and electrically connected to the collector layer.

According to an aspect of the present invention, there is provided a method of fabricating a power semiconductor device, the method including: preparing a first conductivity-type drift layer; forming a second conductivity-type body layer on the drift layer; forming a plurality of trench gates so as to penetrate through the body layer and a portion of the drift layer; forming a preventing film on a surface of the trench gate formed in an immunity improving part; forming a gate oxide on surfaces of the trench gate of a current increasing part and the preventing film of the immunity improving part and filling the trench gate with a polysilicon; forming a first conductivity-type emitter layer on the body layer of the current increasing part; forming an emitter metal layer on the body layer; forming a first conductivity-type buffer layer and a second conductivity-type collector layer below the drift layer; and forming a collector metal layer below the collector layer.

The trench gates may be formed so that a distance from a center of one trench gate to a center of a trench gate adjacent thereto is 3 μm.

The preventing film may be formed of silicon nitride (SiN).

The preventing film may have a thickness of 100 Å to 1,000 Å.

The gate oxide of the current increasing part may have a thickness of 1,000 Å to 2,000 Å.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Hereinafter, embodiments of the present invention will be described in detail with reference to the accompanying drawings. The invention may, however, be embodied in many different forms and should not be construed as being limited to the embodiments set forth herein.

Rather, these embodiments are provided so that this disclosure will be thorough and complete, and will fully convey the scope of the invention to those skilled in the art.

A power switch may be implemented by any one of a power MOSFET, an IGBT, several forms of thyristors, and those similar to the above-mentioned things. Most new technologies disclosed in the present invention will be described based on the IGBT. However, several embodiments of the present invention disclosed in the specification are not limited to the IGBT, but may be generally applied to different forms of power switch technologies including the power MOSFET and the several forms of thyristor, in addition to a diode, for example. Further, several embodiments of the present invention are illustrated as those including specific p-type and n-type regions. However, several embodiments of the present invention may also be equally applied to devices in which a conductivity-type of several regions disclosed in the specification is opposite.

In addition, the n-type and the p-type used in the specification may be defined as a first conductivity-type or a second conductivity-type. Meanwhile, the first conductivity-type and the second conductivity-type refer to conductivity-types different from each other.

In addition, generally, '+' refers to a high Concentration doped state and '−' refers to a low concentration doped state.

Figure 1:
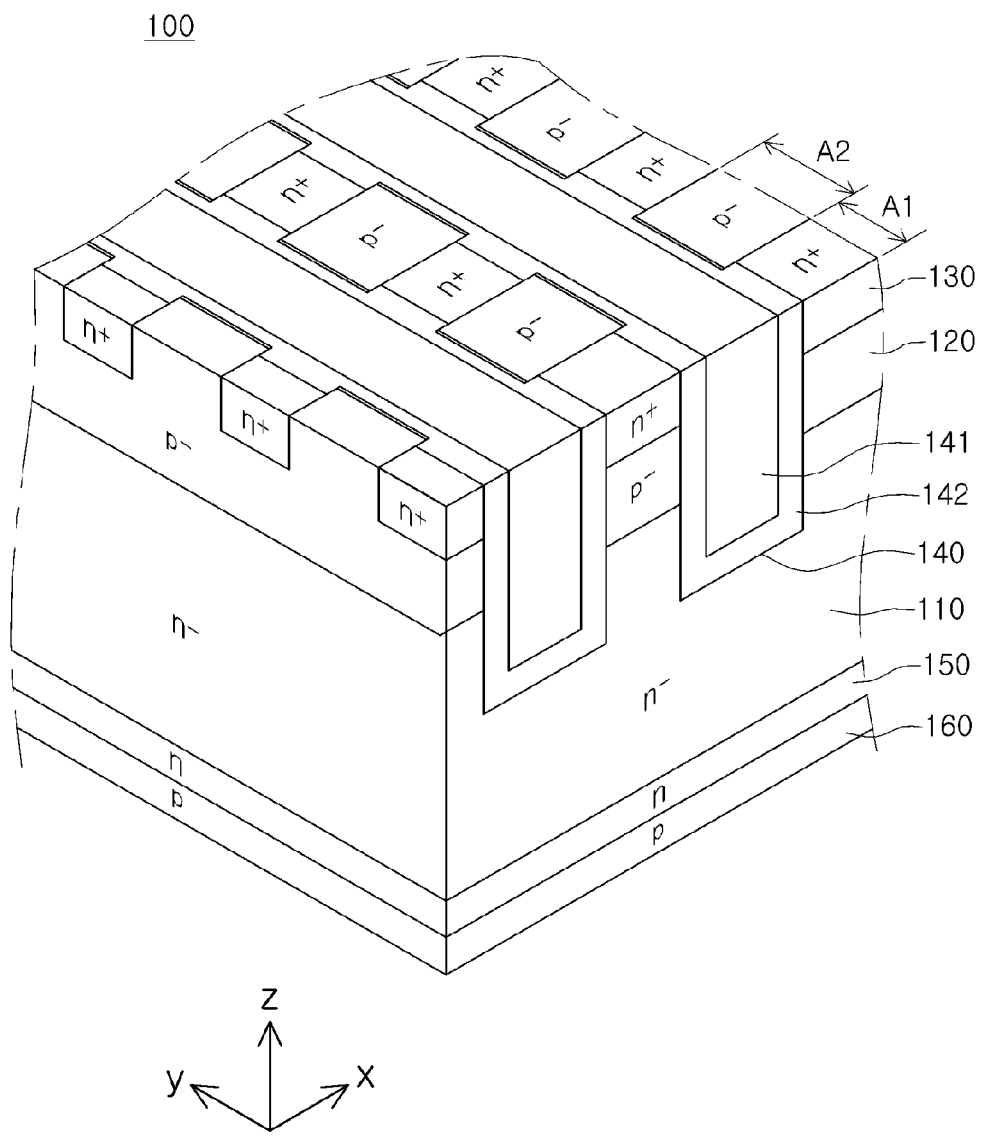
FIG. 1 is a schematic perspective view of a power semiconductor device according to an embodiment of the present invention.
Figure 2:
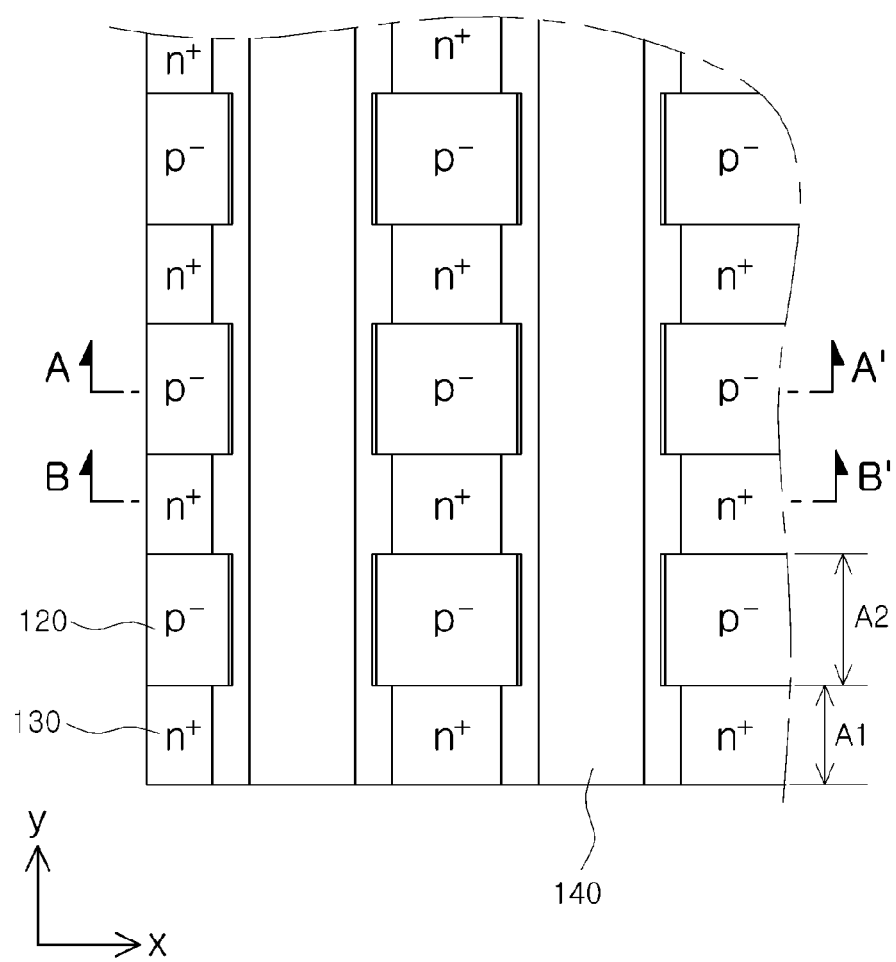
FIG. 2 is a schematic plan view of the power semiconductor device according to the embodiment of the present invention.

FIG. 1 is a schematic perspective view of a power semiconductor device according to an embodiment of the present invention and FIG. 2 is a schematic plan view of the power semiconductor device according to the embodiment of the present invention.

Hereinafter, the power semiconductor device according to the embodiment of the present invention will be described with reference to FIGS. 1 and 2.

The power semiconductor device 100 according to the embodiment of the present invention may include a plurality of trench gates 140 formed to be spaced apart from each other by a predetermined distance, a current increasing part A1 formed between the trench gates 140 and including a first conductivity-type emitter layer 130 and a gate oxide 142 formed on a surface of the trench gate 140, and an immunity improving part A2 formed between the trench gates 140 and including a second conductivity-type body layer 120, a preventing film 143 formed on the surface of the trench gate 140, and a gate oxide 142 having a thickness less than that of the gate oxide 142 of the current increasing part A1.

Figure 3:
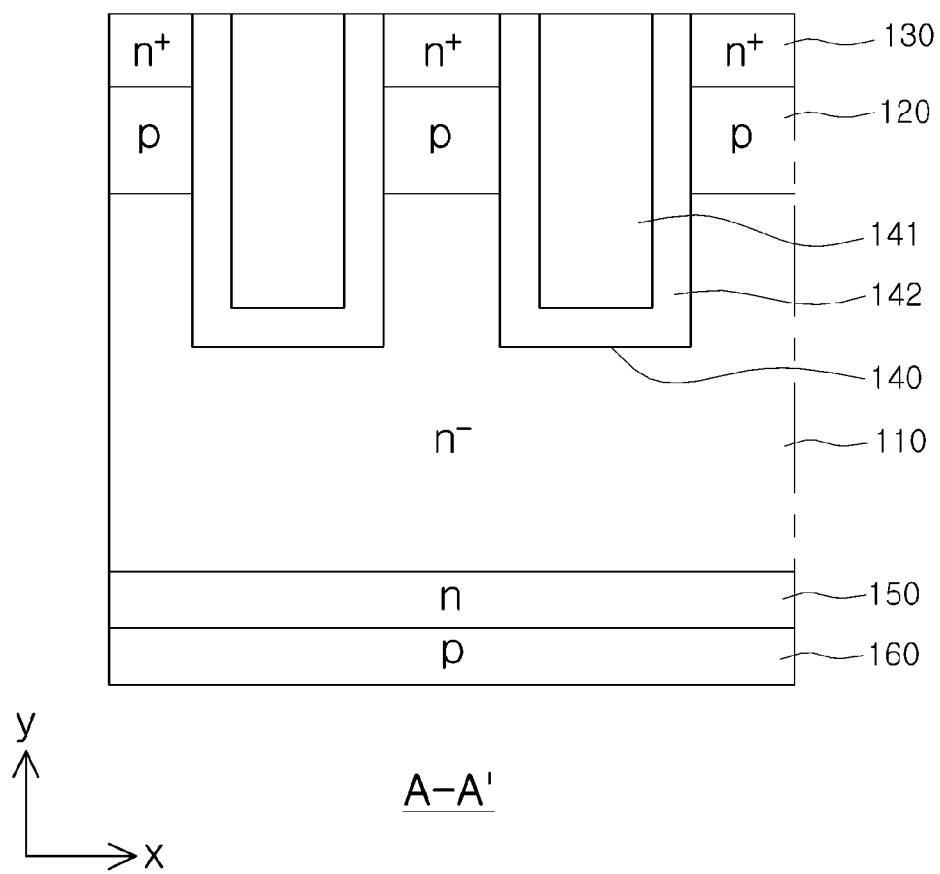
FIG. 3 is a cross-sectional view taken along line A-A' of FIG. 2 according to the embodiment of the present invention.
Figure 4:
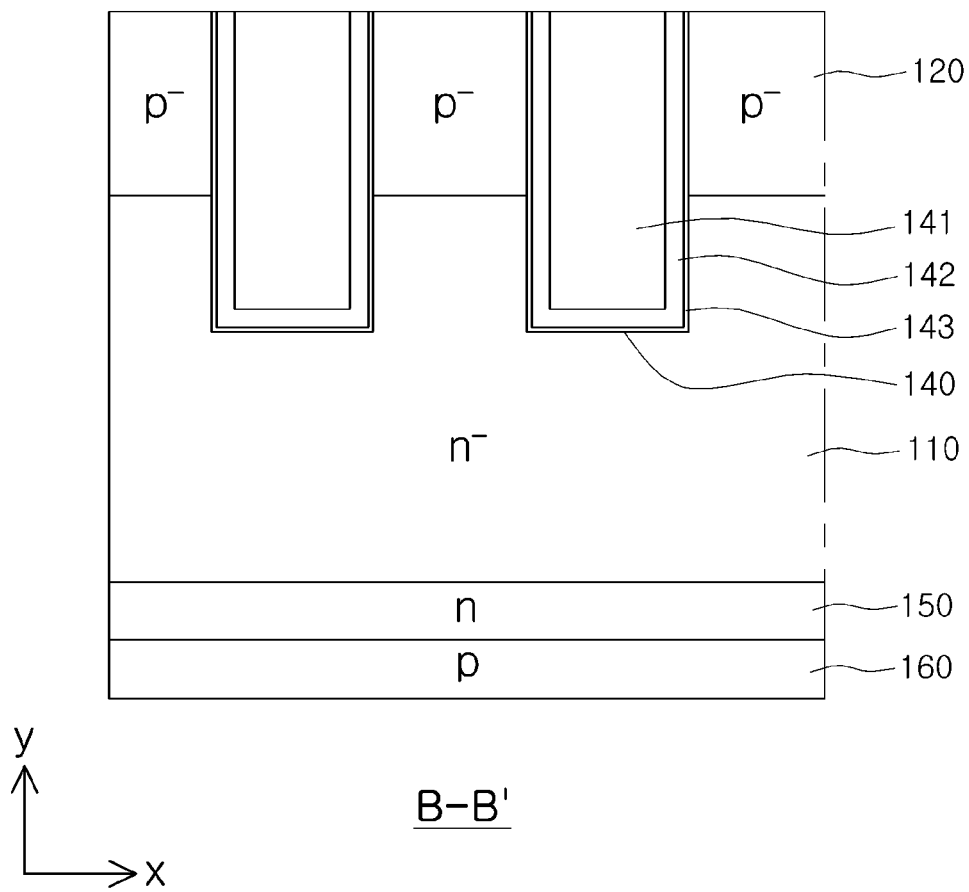
FIG. 4 is a cross-sectional view taken along line B-B' of FIG. 2 according to the embodiment of the present invention.

FIG. 3 is a cross-sectional view taken along line A-A' of FIG. 2 according to the embodiment of the present invention and FIG. 4 is a cross-sectional view taken along line B-B' of FIG. 2 according to the embodiment of the present invention.

The embodiment of the present invention will be described with reference to FIGS. 3 and 4.

An ideal blocking voltage of the power semiconductor device 100 is basically determined by a thickness and an impurity concentration of a drift layer 110.

In order to improve the blocking voltage, the thickness needs to be increased and the impurity concentration needs to be decreased. In this case, since Vice (sat) of the power semiconductor device increases, an appropriate condition is required.

In addition, since a process for maintaining the blocking voltage by a raw material by alleviating a concentration of an electrical field at an edge of a chip is required, the power semiconductor device according to the embodiment of the present invention may include an electric field limiting ring (not shown).

The body layer 120 may have a second conductivity-type and may be formed on the drift layer 110.

The body layer 120 may be formed on the drift layer 110 by an epitaxial method.

The trench gate 140 may be formed by penetrating through the body layer into a part of the drift layer, using a photoresist.

The trench gate 140 of the current increasing part A1 may have a gate insulating layer 142 formed on a surface contacting the drift layer 110, the body layer 120, and the emitter layer 130.

The trench gate 140 of the immunity improving part A2 may have the gate insulating layer 142 and the preventing film 143 formed on a surface contacting the drift layer 110 and the body layer 120.

The trench gate 140 may be filled with a polysilicon 141 or a metal 141.

The trench gate 140 may form a channel in the body layer 120 contacting the trench gate 140 at the time of turning the device on.

Since the power semiconductor device according to the embodiment of the present invention has the gate 140 taking a form of a metal oxide semiconductor (MOS), in the case in which a voltage is applied to the gate 140, the channel is formed in the body layer 120, such that the power semiconductor device is operated.

That is, when a voltage higher than a threshold voltage of the device is applied to a gate electrode electrically connected to the polysilicon or the metal in the trench gate 140, polarity on the surface of the body layer 120 of a lower end of the electrode is reversed to thereby form the channel. As a result, the power semiconductor device is operated as a transistor.

The gate oxide 142 of the current increasing part A1 may have a thickness thicker than that of the gate oxide 142 of the immunity improving part A2.

A width (x direction) of the emitter layer 130 of the current increasing part A1 may be relatively small, as compared to a width (x direction) of the body layer 120 of the immunity improving part A2.

That is, as the width of the body layer 120 positioned below the emitter layer 130 of the current increasing part A1 is reduced, a conductivity modulation effect is generated in the body layer 120.

Therefore, the conductivity modulation effect is derived from the body layer 120 positioned below the emitter layer 130 by increasing the thickness of the gate oxide 142 of the current increasing part A1 and decreasing the width (x direction) of the emitter layer 130, such that the current density may be increased.

In addition, the gate oxide 142 of the immunity improving part A2 may have a thickness less than that of the gate oxide 142 of the current increasing part A1.

That is, the body layer 120 may have a wider contact area as compared to the emitter layer 130.

Therefore, a hole current may smoothly flow into the body layer 120, such that the short circuit immunity may be improved.

That is, since the gate oxide 142 of the current increasing part A1 has the thickness thicker than that of the gate oxide 142 of the immunity improving part A2, current density may be increased and short circuit immunity may be improved.

A length (y direction) of the body layer 120 may be formed to be relatively long, as compared to a length (y direction) of the emitter layer 130.

That is, the body layer 120 may have a wider contact area as compared to the emitter layer 130 by forming the length (y direction) of the body layer 120 so as to be long as compared to the length (y direction) of the emitter layer 130.

The length of the emitter layer 130 may be $1/20$ through $1/4$ of the length of the body layer 120.

In the case in which the length of the emitter layer 130 is less than $1/20$ of the length of the body layer 120, the flow of the electronic current is hindered, such that the current density may be decreased, and in the case in which the length of the emitter layer 130 exceeds $1/4$ of the length of the body layer 120, the flow of the hole current passing through the body layer 120 is hindered, such that latch-up due to a short circuit may be generated.

Therefore, the length of the emitter layer 130 may be $1/20$ through $1/4$ of the length of the body layer 120 such that the hole current may smoothly flow into the body layer 120 and thus the short circuit immunity may be improved.

According to the embodiment of the present invention, the trench gates 140 may be formed so that a distance from a center of the trench gate 140 to a center of the trench gate 140 adjacent thereto is spaced apart from by 3 μm.

Recently, in accordance with a trend for miniaturization and slimming of devices, the distance between the trench gates 140 adjacent to each other has been reduced.

Therefore, the current density in the power semiconductor device 100 is mainly determined by the electronic current.

Therefore, the current density of the device may be increased by increasing the above-mentioned electronic current.

In a case of the power semiconductor device according to the embodiment of the present invention, since the gate oxide 142 of the current increasing part A1 has the thickness thicker than that of the gate oxide 142 of the immunity improving part A2, the electronic current may be increased using the conductivity modulation effect, such that the current density of the device may be increased.

In addition, in order to achieve the increase in the short circuit immunity having the trade-off relationship with the increase in the current density of the device, the gate oxide 142 of the immunity improving part A2 may have the thickness less than that of the gate oxide 142 of the current increasing part A1.

That is, the body layer 120 may have a wider contact area as compared to the emitter layer 130.

Therefore, the hole current may smoothly flow into the body layer 120, such that the short circuit immunity may be improved.

In general, a gate oxide film 142 is formed using a silicon oxide ($SiO_2$) and the impurity in the body layer 120 is adjusted by injecting boron.

In the case in which the silicon oxide ($SiO_2$) contacts boron of the body layer 120, a deposition phenomenon of boron is generated on a surface of the silicon oxide ($SiO_2$).

As described above, in the case in which the deposition phenomenon of boron is generated on the gate oxide film, Vth may not be constant along the channel formed at the time of the operation of turning the device on. This refers to that when the power semiconductor device having the channel formed therein is operated in a short circuit mode, unstability of Vth due to a flow of high current is increased.

The unstability of Vth may further promote a ripple phenomenon of collector current. This may cause an unstable state of the short circuit immunity of the power semiconductor device.

Therefore, stability of the short circuit immunity may be secured by positioning the preventing film 143 between the gate 140 and the body layer 120 contacting with each other.

The preventing film 143 may be formed of a material capable of preventing the impurity injected into the body layer 120 from being deposited, but is not limited thereto.

The preventing film 143 may be formed of silicon nitride (SiN).

In the case in which a dual film of the silicon oxide and the silicon nitride is configured between the trench gate 140 and the body layer 120 of the immunity improving part A2 according to the embodiment of the present invention, the unstability of Vth may be decreased.

That is, the deposition preventing film 143 prevents boron from being deposited with the silicon oxide, such that the constant Vth along the channel may be obtained at the time of the operation of turning the device on.

In addition, gate capacitance is decreased as compared to an existing structure by using the silicon nitride.

Therefore, in accordance with the decrease in the gate capacitance, Vth may be increased.

Further, a growth of the gate oxide 142 may be suppressed by forming the preventing film 143 on the surface of the trench gate 140 of the immunity improving part A2.

Therefore, the gate oxide 142 of the immunity improving part A2 may have the thickness less than that of the gate oxide 142 of the current increasing part A1.

The preventing film 143 may have a thickness of 100 Å to 1,000 Å.

In the case in which the thickness of the preventing film 143 is less than 100 Å, the effect of suppressing the growth of the gate oxide 142 is decreased, and in the case in which the thickness of the preventing film 143 exceeds 1,000 Å, defects such as irregularity of the silicon nitride, a related defect, and the like are increased and performance of a high temperature heat treatment is requested, such that processing costs are significantly increased.

According to the embodiment of the present invention, the gate oxide 142 of the current increasing part may have a thickness of 1,000 Å to 2,000 Å.

As the thickness of the gate oxide 142 is increased, a relative high-speed switching operation of the device may be possible due to a decrease in gate capacitance.

In contrast, as the thickness of the gate oxide 142 is decreased, the relative high-speed switching operation of the device may be impossible due to an increase in gate capacitance.

The gate oxide 142 of the current increasing part A1 may have the thickness of 1,000 Å to 2,000 Å.

In the case in which the thickness of the gate oxide 142 of the current increasing part A1 is less than 1,000 Å, the gate capacitance is decreased, such that the high-speed switching operation of the device is impossible, and in the case in which the thickness of the gate oxide 142 of the current increasing part A1 exceeds 2,000 Å, the threshold voltage is significantly increased and a gate driving is increased, thereby degrading use characteristics of devices.

Figure 5:
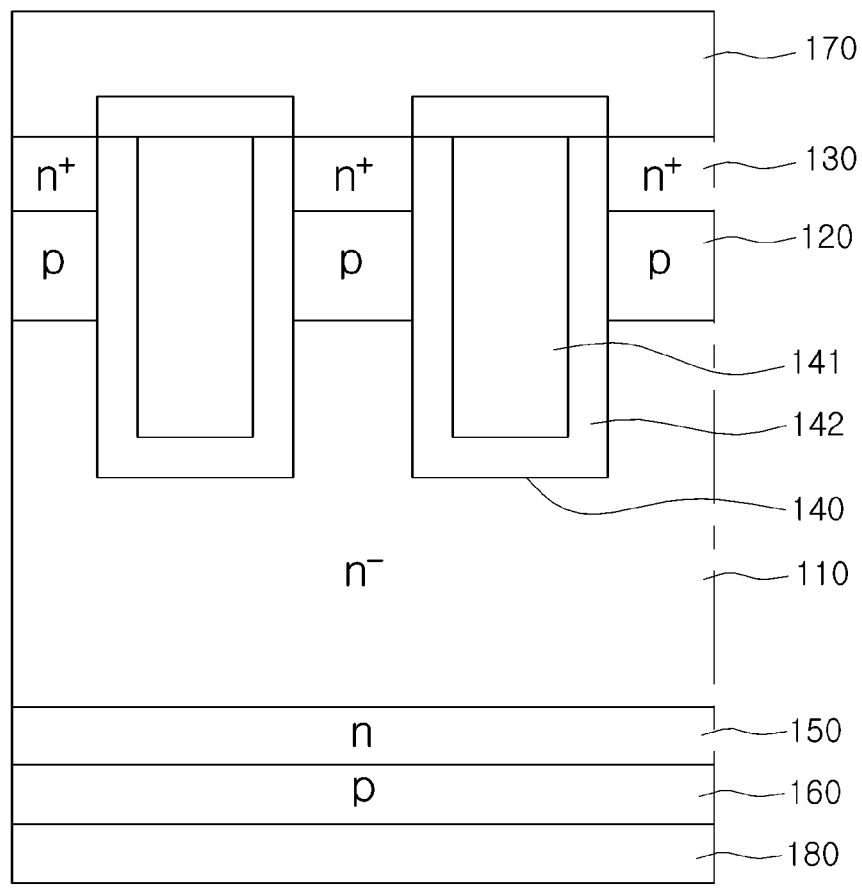
FIG. 5 is a cross-sectional view taken along line A-A' of FIG. 2 according to another embodiment of the present invention.
Figure 5:
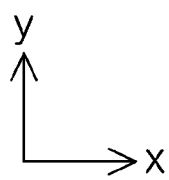

FIG. 5 is a cross-sectional view taken along line A-A' of FIG. 2 according to another embodiment of the present invention.

Referring to FIG. 5, the power semiconductor device 100 according to another embodiment of the present invention may include a first conductivity-type drift layer 110; a second conductivity-type body layer 120 formed on the drift layer 110; a plurality of trench gates 140 formed by penetrating through the body layer 120 and a portion of the drift layer 110; a current increasing part A1 formed between the trench gates 140 and including a first conductivity-type emitter layer 130 formed on the body layer 120 and a gate oxide 142 formed on a surface of the trench gate 140; an immunity improving part A2 including a preventing film 143 formed on the surface of the trench gate 140 and a gate oxide 142 having a thickness less than that of the gate oxide 142 of the current increasing part A1; and a second conductivity-type collector layer 160 formed below the drift layer 110.

In the collector layer 160, since the electronic current injected through the channel formed in the body layer 120 derives an injection of the hole current from the collector layer 160 to thereby generate a high concentration injection of a few carriers at the time of the operation of turning the device on, the conductivity modulation increasing conductivity from tens to hundreds of times is generated.

Therefore, the resistive component in the drift layer 110 is significantly reduced due to the conductivity modulation, such that an application in a high voltage is possible.

According to another embodiment of the present invention, a first conductivity-type buffer layer 150 is further included between the drift layer 110 and the collector layer 160.

The buffer layer 150 may provide a field stop function.

Therefore, the power semiconductor device according to another embodiment of the present invention may have a thinner drift layer 110 under the same blocking voltage condition as compared to a case without the buffer layer 150.

The power semiconductor device 100 according to the embodiment of the present invention may further include an emitter metal layer 170 formed on the emitter layer 130 and electrically connected to the emitter layer 130; and a collector metal layer 180 formed below the collector layer 160 and electrically connected to the collector layer 160.

Figure 6:
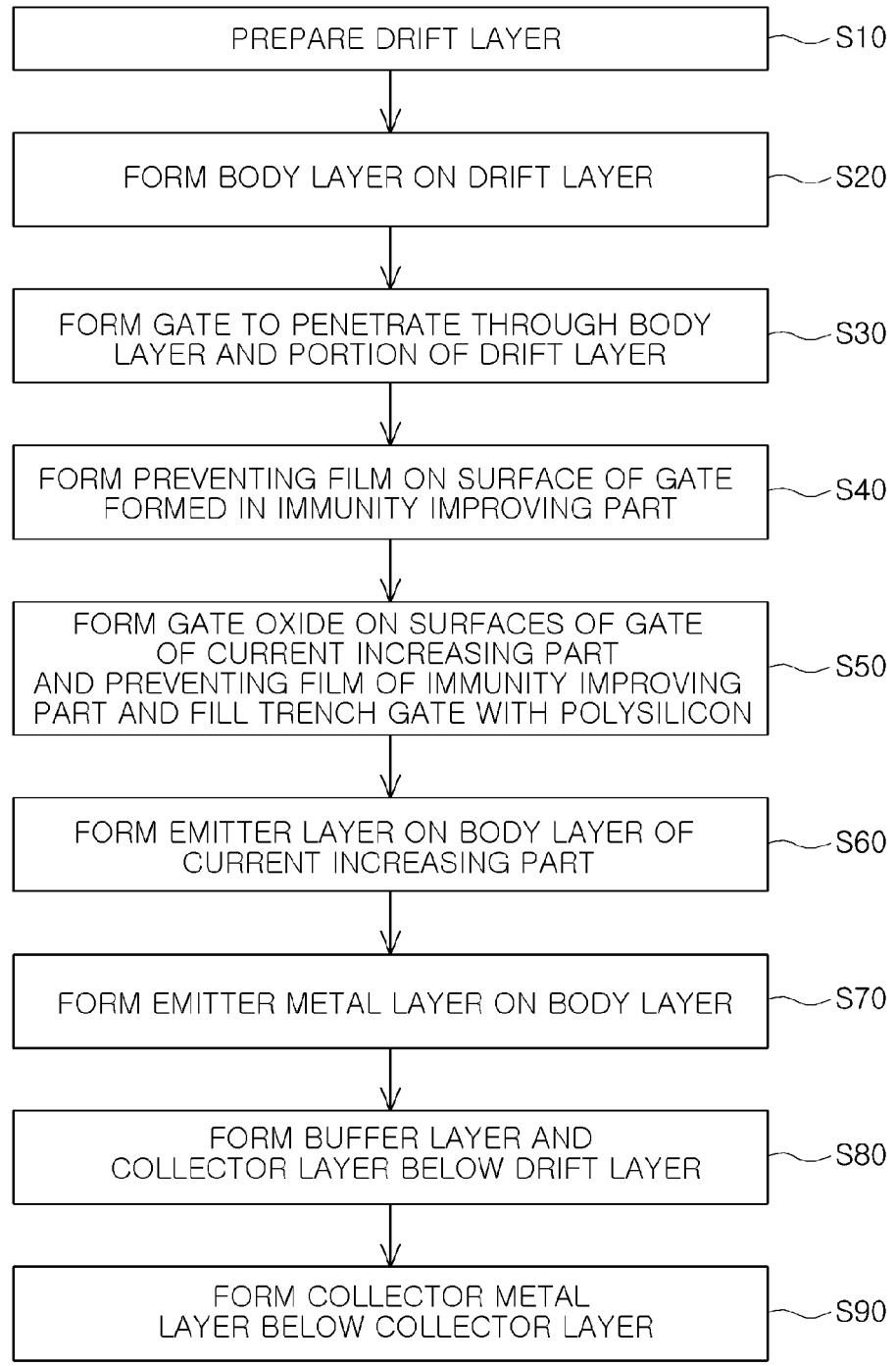
FIG. 6 is a flow chart schematically showing a method of fabricating a power semiconductor device according to an embodiment of the present invention.

FIG. 6 is a flow chart schematically illustrating a method of fabricating a power semiconductor device 100 according to an embodiment of the present invention.

Referring to FIG. 6, the method of fabricating a power semiconductor device 100 according to an embodiment of the present invention may include preparing a first conductivity-type drift layer 110 (S10); forming a second conductivity-type body layer 120 on the drift layer 110 (S20); forming a plurality of trench gates 140 so as to penetrate through the body layer 120 and a portion of the drift layer 110 (S30); forming a preventing film 143 on a surface of the trench gate 140 formed in an immunity improving part A2 (S40); forming a gate oxide 142 on the surface of the trench gate 140 of a current increasing part A1 and the preventing film 143 of the immunity improving part A2 and filling the trench gate 140 with a polysilicon 141 or a metal 141 (S50); forming an emitter layer 130 on the body layer 120 of the current increasing part A1 (S60); forming an emitter metal layer 170 on the body layer 120 (S70); forming a first conductivity-type buffer layer 150 and a second conductivity-type collector layer 160 below the drift layer 110 (S80); and forming a collector metal layer 180 below the collector layer 160 (S90).

The forming of the body layer 120 (S20) may be performed by an epitaxial method.

The body layer 120 may be grown until it has an appropriate height by the epitaxial method.

The forming of the trench gate (S30) may be performed through etching to penetrate through the body layer 120 and intrude into a portion of the drift layer 110, using a mask.

The forming of the preventing film 143 (S40) may be performed using chemical vapor deposition (CVD).

The forming of the preventing film 143 (S40) may be performed using plasma-enhanced CVD.

The preventing film 143 may be formed of silicon nitride (SiN).

The forming of the gate oxide 142 on the surface of the trench gate 140 of the current increasing part A1 and the preventing film 143 of the immunity improving part A2 (S50) may be performed by simultaneously depositing the gate oxide 142 on the current increasing part A1 and the immunity improving part A2.

Since the preventing film 143 is formed on the surface of the trench gate 140 of the immunity improving part A2, the formation of the gate oxide 142 is suppressed as compared to the trench gate 140 of the current increasing part A1.

Therefore, the gate oxide 142 of the immunity improving part A2 may have the thickness less than that of the gate oxide 142 of the current increasing part A1.

In the forming of the emitter layer 130 (S60), a first conductivity-type impurity may be injected and a heat treatment may then be performed.

By injecting the first conductivity-type impurity into the emitter layer 130 and then performing the heat treatment, a dispersion of the injected impurity is generated.

Therefore, a length of the channel may be adjusted, and further, a resistance of the channel may be adjusted, by appropriately adjusting an injection amount of the impurity and a heat treatment time.

The method may further include forming an emitter metal layer 170 electrically connected to the emitter layer 130, on the emitter layer 130 (S70), after the forming of the emitter layer 130 (S60).

After the forming of the emitter metal layer 170 (S70), a rear surface of the body layer 120 may be appropriately removed.

The removal of the rear surface of the body layer 120 may be performed using a grinding.

By decreasing the thickness of the body layer 120, the blocking voltage may be adjusted and thinness of the device may be promoted.

The method may further include forming a first conductivity-type buffer layer 150 below the body layer 120 (S80), after removing the rear surface of the body layer 120.

The buffer layer 150 may be formed by injecting the first conductivity-type impurity.

After performing the forming of the buffer layer 150 (S80), the collector layer 160 may be formed below the buffer layer 150 (S80).

The method may further include forming a collector metal layer 180 electrically connected to the collector layer 160 below the collector layer 160 (S90), after performing the forming of the collector layer 160 (S80).

As set forth above, the power semiconductor device according to the embodiment of the present invention has a structure having the gate oxide film of the immunity improving part having the thickness less than that of the gate oxide film of the current increasing unit, such that the distance between the gates of the current increasing part into which the electronic current flows may be relatively small and the distance between the gates of the immunity improving part not contributing to the electronic current may be long.

Therefore, according to the above-mentioned structure, the short circuit immunity of the power semiconductor device may be improved and the current density of the power semiconductor device may be increased.

In addition, since the preventing film having the dielectric constant lower than that of the gate oxide film is formed on the surface of the gate of the immunity improving unit, the capacitance of the gate is decreased as compared to the related art, such that Vth may be increased.

While the present invention has been shown and described in connection with the embodiments, it will be apparent to those skilled in the art that modifications and variations can be made without departing from the spirit and scope of the invention as defined by the appended claims.

What is claimed is:

1. A power semiconductor device, comprising:
  a plurality of trench gates formed to be spaced apart from each other by a predetermined distance;
  a current increasing part formed between the trench gates and including a first conductivity-type emitter layer and a gate oxide formed on a surface of the trench gate; and
  an immunity improving part formed between the trench gates and including a second conductivity-type body layer, a preventing film formed on the surface of the trench gate, and a gate oxide having a thickness less than that the gate oxide of the current increasing part.

2. The power semiconductor device of claim 1, wherein the trench gates are formed so that a distance from a center of one trench gate to a center of a trench gate adjacent thereto is 3 μm.

3. The power semiconductor device of claim 1, wherein the preventing film is formed of silicon nitride (SiN).

4. The power semiconductor device of claim 1, wherein the preventing film has a thickness of 100 Å to 1,000 Å.

5. The power semiconductor device of claim 1, wherein the gate oxide of the current increasing part has a thickness of 1,000 Å to 2,000 Å.

6. A power semiconductor device, comprising:
  a first conductivity-type drift layer;
  a second conductivity-type body layer formed on the drift layer;
  a plurality of trench gates formed to penetrate through the body layer and a portion of the drift layer;
  a current increasing part formed between the trench gates and including a first conductivity-type emitter layer formed on the body layer and a gate oxide formed on a surface of the trench gate;
  an immunity improving part including a preventing film formed on the surface of the trench gate and a gate oxide having a thickness less than that the gate oxide of the current increasing part; and
  a second conductivity-type collector layer formed blow the drift layer.

7. The power semiconductor device of claim 6, wherein the trench gates are formed so that a distance from a center of one trench gate to a center of a trench gate adjacent thereto is 3 μm.

8. The power semiconductor device of claim 6, wherein the preventing film is formed of silicon nitride (SiN).

9. The power semiconductor device of claim 6, wherein the preventing film has a thickness of 100 Å to 1,000 Å.

10. The power semiconductor device of claim 6, wherein the gate oxide of the current increasing part has a thickness of 1,000 Å to 2,000 Å.

11. The power semiconductor device of claim 6, further comprising a first conductivity-type buffer layer between the drift layer and the collector layer.

12. The power semiconductor device of claim 6, further comprising:
 an emitter metal layer formed on the emitter layer and electrically connected to the emitter layer; and
 a collector metal layer formed below the collector layer and electrically connected to the collector layer.

13. A method of fabricating a power semiconductor device, the method comprising:
 preparing a first conductivity-type drift layer;
 forming a second conductivity-type body layer on the drift layer;
 forming a plurality of trench gates so as to penetrate through the body layer and a portion of the drift layer;
 forming a preventing film on a surface of the trench gate formed in an immunity improving part;
 forming a gate oxide on surfaces of the trench gate of a current increasing part and the preventing film of the immunity improving part and filling the trench gate with a polysilicon;
 forming a first conductivity-type emitter layer on the body layer of the current increasing part;
 forming an emitter metal layer on the body layer;
 forming a first conductivity-type buffer layer and a second conductivity-type collector layer below the drift layer; and
 forming a collector metal layer below the collector layer.

14. The method of claim 13, wherein the trench gates are formed so that a distance from a center of one trench gate to a center of a trench gate adjacent thereto is 3 µm.

15. The method of claim 13, wherein the preventing film is formed of silicon nitride (SiN).

16. The method of claim 13, wherein the preventing film has a thickness of 100 Å to 1,000 Å.

17. The method of claim 13, wherein the gate oxide of the current increasing part has a thickness of 1,000 Å to 2,000 Å.

* * * * *

UNITED STATES PATENT AND TRADEMARK OFFICE
CERTIFICATE OF CORRECTION

PATENT NO.        : 8,981,423 B2
APPLICATION NO.   : 13/937589
DATED             : March 17, 2015
INVENTOR(S)       : Dong Soo Seo et al.

Page 1 of 1

It is certified that error appears in the above-identified patent and that said Letters Patent is hereby corrected as shown below:

In the claims

In Claim 6:

Column 10, Line 62, Delete "blow" insert -- below --, therefor.

Signed and Sealed this
Thirteenth Day of October, 2015

Michelle K. Lee
*Director of the United States Patent and Trademark Office*